(12) United States Patent
Bollati et al.

(10) Patent No.: US 7,986,479 B2
(45) Date of Patent: Jul. 26, 2011

(54) CIRCUIT FOR CORRECTING SIGNAL DISTORTIONS

(75) Inventors: Giacomino Bollati, Castel San Giovanni (IT); Marco Bongiorni, Castel San Giovanni (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 1078 days.

(21) Appl. No.: 11/711,477

(22) Filed: Feb. 26, 2007

(65) Prior Publication Data

US 2007/0247226 A1 Oct. 25, 2007

(30) Foreign Application Priority Data

Feb. 24, 2006 (IT) .............................. MI2006A0330

(51) Int. Cl.
*G11B 5/09* (2006.01)
(52) U.S. Cl. ................. 360/46; 360/25; 360/65; 360/67
(58) Field of Classification Search ........................ None
See application file for complete search history.

(56) References Cited

U.S. PATENT DOCUMENTS

| | | | | | |
|---|---|---|---|---|---|
| 4,459,554 | A | * | 7/1984 | Mattisson | 330/107 |
| 4,794,342 | A | * | 12/1988 | Kimura | 330/2 |
| 5,343,163 | A | * | 8/1994 | Linder et al. | 330/252 |
| 5,479,137 | A | * | 12/1995 | Harford | 331/117 R |
| 5,744,993 | A | * | 4/1998 | Sonntag | 327/307 |
| 6,040,732 | A | * | 3/2000 | Brokaw | 327/408 |
| 6,043,943 | A | * | 3/2000 | Rezzi et al. | 360/46 |
| 6,157,510 | A | * | 12/2000 | Schreck et al. | 360/77.06 |
| 6,400,518 | B1 | * | 6/2002 | Bhaumik et al. | 360/25 |
| 6,529,340 | B2 | * | 3/2003 | Gowda et al. | 360/25 |
| 6,633,447 | B2 | * | 10/2003 | Franck et al. | 360/67 |
| 7,038,501 | B2 | * | 5/2006 | Lee et al. | 327/108 |
| 7,161,752 | B1 | * | 1/2007 | Cheng | 360/46 |
| 7,339,760 | B2 | * | 3/2008 | Gleason et al. | 360/67 |
| 2002/0053935 | A1 | * | 5/2002 | Katakura et al. | 327/362 |
| 2002/0176197 | A1 | | 11/2002 | Franck et al. | |

* cited by examiner

*Primary Examiner* — Dismery E Mercedes
(74) *Attorney, Agent, or Firm* — Lisa K. Jorgenson; Kevin D. Jablonski; Graybeal Jackson LLP

(57) ABSTRACT

A corrector circuit for correcting second harmonic distortions is provided. The corrector circuit includes a transconductance circuit having an input transconductance with a transresistance load for receiving a distorted voltage signal having a second harmonic component. The transconductance circuit is adapted to generate a corrected voltage signal having the second harmonic component that is reduced from the distorted voltage signal as a function of the input transconductance. The corrector circuit further includes biasing means for providing a biasing current to the transconductance circuit (with the input transconductance that depends on the biasing current). The biasing means includes means for providing a fixed component of the biasing current, means for providing a variable component of the biasing current (being a function of the distorted voltage signal according to a proportionality coefficient) and means for programming the proportionality coefficient.

11 Claims, 3 Drawing Sheets

CIRCUIT FOR CORRECTING SIGNAL DISTORTIONS

This application claims priority from Italian patent application No. MI2006A000330, filed Feb. 24, 2006, which is incorporated herein by reference.

TECHNICAL FIELD

An embodiment of the present invention refers to the analog circuits field. More particularly, an embodiment relates to the correction of second harmonic distortions.

BACKGROUND

The distortion in electric signals is a problem that is felt in several applications. A typical example regards the magneto-resistive read heads, which are typically used in hard disk mass-storage systems.

In such storage systems, data is saved onto a magnetic disk by means of several magnetization statuses of corresponding cells. The reading of such data is performed by means of read heads, which are transducer devices capable of generating a corresponding analog voltage signal transduced from the magnetic field corresponding to the different magnetization statuses. The modern read heads that are used in the hard disk mass-storage systems are based on the magneto-resistive technology. Said heads are made by means of a material that modifies its electric resistance in presence of a magnetic field. A typical hard disk mass-storage system further includes a circuit adapted to interpret the reading signal provided by the read head, and to generate a corresponding output bit stream, representing the data read from the hard disk.

Unfortunately, the use of magneto-resistive read heads may alter the reading signal. Indeed, because of a phenomenon known as "magneto-resistive asymmetry", the reading signal may feature second harmonic distortions, having an intensity that is proportional to the amplitude of the signal itself. Such second harmonic distortions may cause errors in the interpretation of the reading signal, such as to provoke the generation of a wrong output bit stream.

The characteristics of the second harmonic distortion due to the magneto-resistive asymmetry phenomenon depends on the type of read head used, and thus it is not foreseeable a priori. As a consequence, in order to be able to use magneto-resistive read heads without causing an erroneous interpretation of the data read, it is desirable to be capable of eliminating, or at least reducing as much as possible, whichever second harmonic distortion's characteristics that may be present in the reading signal.

A possible solution is described in US 2002/0176197, which is incorporated by reference. Such document proposes a corrector circuit consisting of a pair of common-follower stages coupled with a differential load. The reduction of the second harmonic distortion is carried out by regulating the differential load, which is composed by two MOS transistors having different and programmable aspect ratios.

SUMMARY

An embodiment of the present invention proposes an alternative solution to the abovementioned problem.

Particularly, an embodiment of the present invention proposes a corrector circuit for correcting second harmonic distortions. The corrector circuit includes a transconductance circuit having an input transconductance with a transresistance load for receiving a distorted voltage signal having a second harmonic component. The transconductance circuit is adapted to generate a corrected voltage signal having the second harmonic component that is reduced from the distorted voltage signal as a function of the input transconductance. The corrector circuit further includes biasing means for providing a biasing current to the transconductance circuit (with the input transconductance that depends on the biasing current). The biasing means includes means for providing a fixed component of the biasing current, means for providing a variable component of the biasing current (being a function of the distorted voltage signal according to a proportionality coefficient) and means for programming the proportionality coefficient.

In an embodiment, the transconductance circuit and the load have a differential structure.

The variable component may be generated according to the difference between two components.

The two components may be generated by means of further transconductance circuits (whose input transconductance depends on two corresponding biasing currents).

In this case as well, the transconductance means may have a differential structure.

A way for improving the solution is to remove a linearization current (corresponding to the sum of the two biasing currents) from the variable component.

In an embodiment of the invention, the linearization current is provided by a corresponding generator.

In an embodiment, the fixed component is obtained from the (constant) sum of the two biasing currents.

A way for further improving the solution is to remove the variable component from the load.

This result may be obtained by means of a further linearization current (provided by a corresponding generator).

An additional embodiment of the present invention provides a corresponding reading device for a mass-storage system.

Said device may be based on a magneto-resistive read head.

A further embodiment of the present invention provides a mass-storage system including the reading device.

Said storage system may include a magnetic hard disk.

Another embodiment of the present invention provides a corresponding correction method.

BRIEF DESCRIPTION OF THE DRAWINGS

One or more embodiments of the invention, as well as further features and the advantages thereof, may be best understood by reference to the following detailed description, given purely by way of a non-restrictive indication, to be read in conjunction with the accompanying drawings.

DETAILED DESCRIPTION

Figure 1:
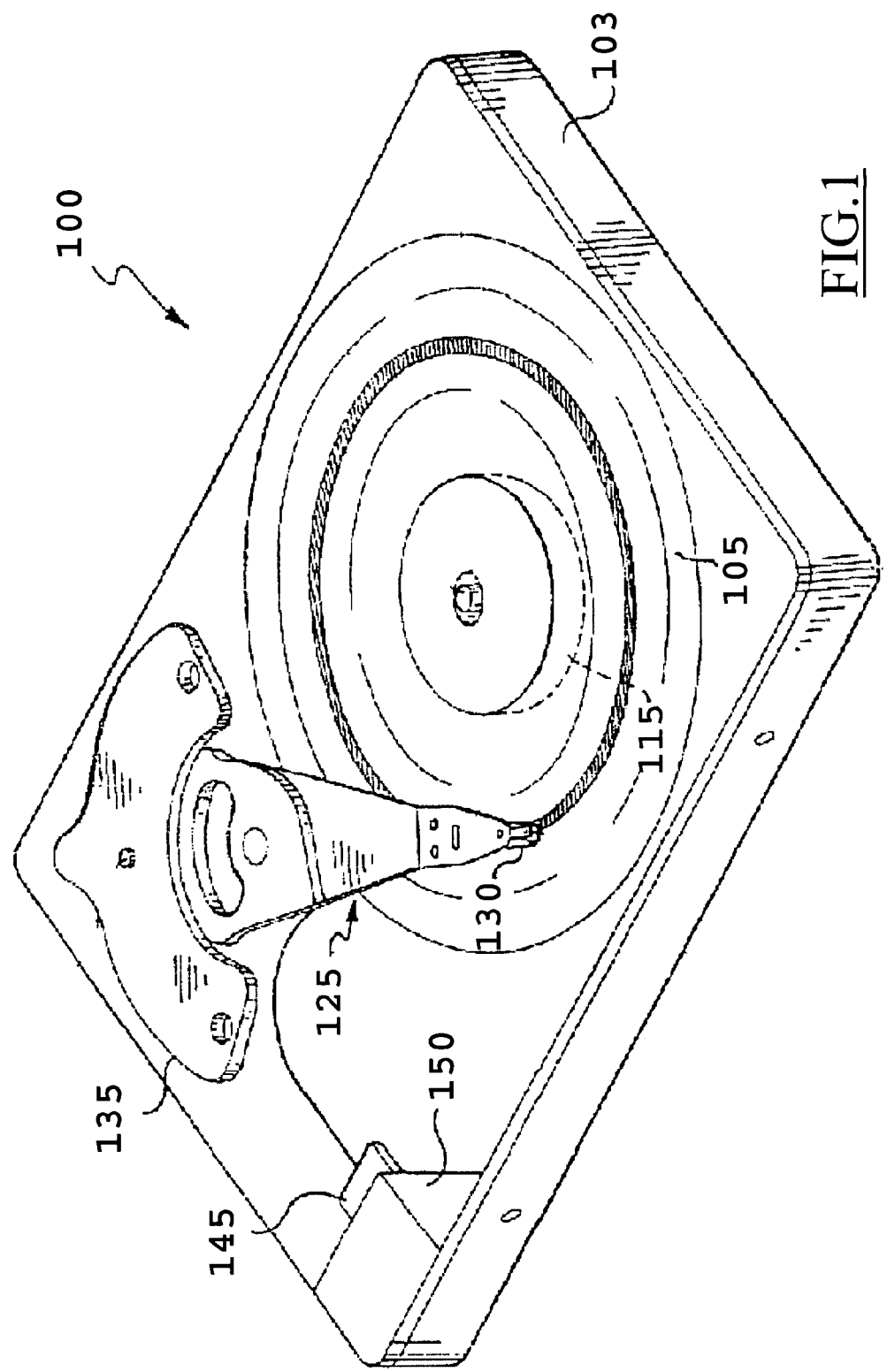
FIG. 1 illustrates a mass-storage system in which the solution according to an embodiment of the present invention is applicable.

With reference in particular to FIG. 1, there is shown an embodiment of a mass-storage system 100 being implemented in a sealed box 103. The sealed box 103 houses a disk 105 composed by a rigid circular support covered by ferromagnetic material. The disk 105 comprises a plurality of concentric tracks divided into memory cells. Each cell stores a bit of data, represented by different magnetization states of the ferromagnetic material. A motor 115 maintains the disk 105 in rotation at a constant or approximately constant speed.

The mass-storage system 100 includes a rotating arm 125, which terminates with a flexible suspension, on the free edge thereof a magneto-resistive head 130 is mounted.

An actuator 135 allows the arm 125 to rotate around a relative pin. The head 130 is thus moved in a direction that is substantially radial to the disk 105, in such a way to be positioned over the desired track.

The head 130 is connected to an analog/digital circuit 145 integrated in a chip of semiconductor material. The circuit 145 processes a voltage signal provided by the head 130 during a data read operation. The circuit 145 is connected to a control unit 150 that brings the mass-storage system 100 in communication with the outside. The unit 150 is further connected to the actuator 135 in such a way to control the movements of the head 130 on the desired track and the position of the head 130 within the track.

The head 130 acts as a transducer of the magnetic field generated by the magnetization status of the ferromagnetic material that forms the memory cells on which it is positioned. More particularly, the head 130 senses the presence or the absence of inversions of the magnetic field flux that may generate during the passage from one memory cell to another. The read head 130 generates in turn a corresponding reading voltage signal Vin. Such reading signal Vin is an analog signal, and is generally composed by a series of voltage pulses, positive and negative.

The analog/digital circuit 145 includes several circuit components adapted to interpret the (analog) reading signal Vin generated by the head 130, thereby generating a corresponding data bit stream associated therewith. Furthermore, the analog/digital circuit 145 is adapted to execute error detection and correction algorithms on the data bit stream that has been interpreted, in such a way to assure that the reading operation is accomplished in a correct way. In particular, the analog/digital circuit 145 may correct the second harmonic distortions in the reading signal Vin caused by the magneto-resistive asymmetry phenomenon.

Figure 2:
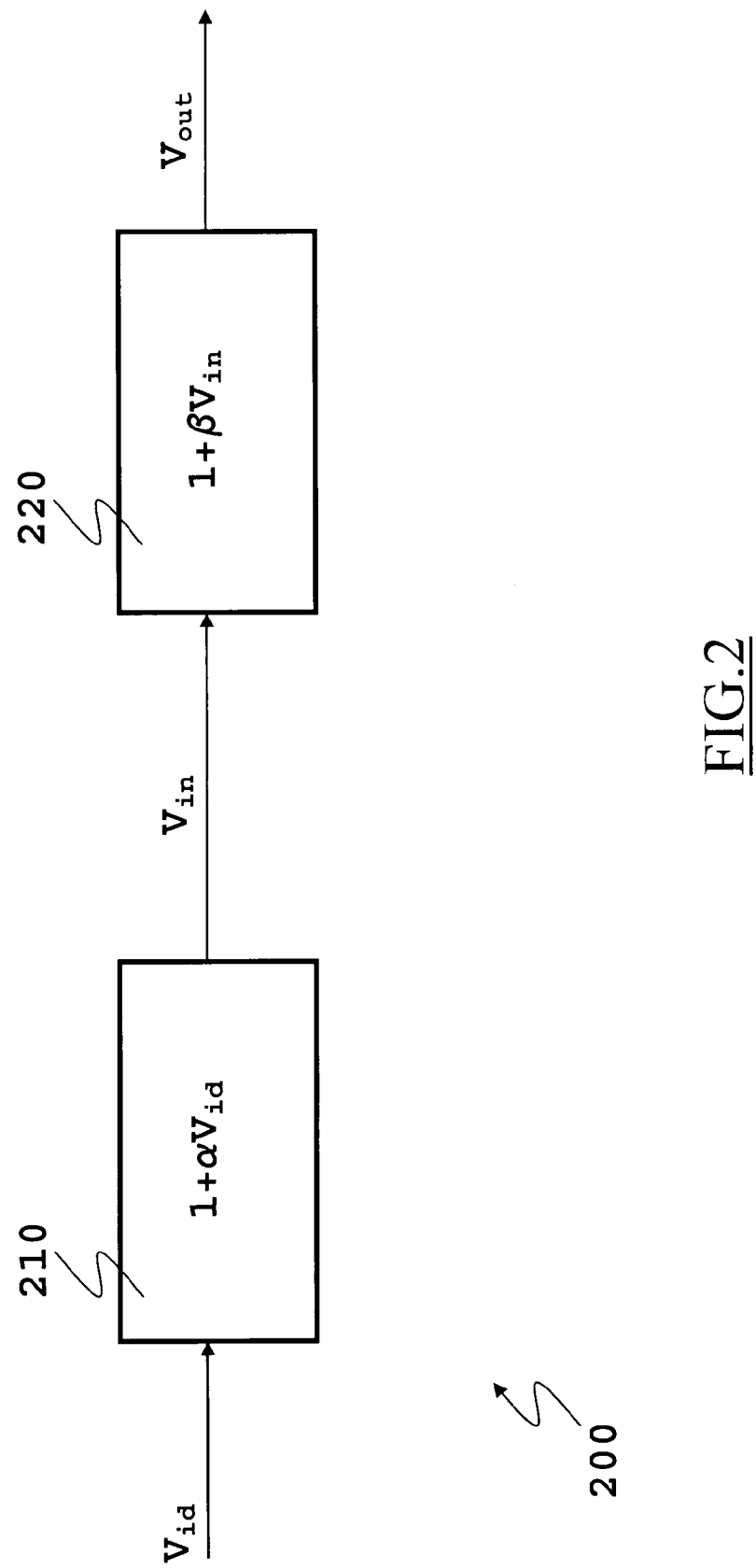
FIG. 2 illustrates a block diagram representing a model of the magneto-resistive effect and of a respective corrector circuit according to an embodiment of the present invention.

Making reference to FIG. 2, the operation of a portion of such mass-storage system is schematically represented by a block diagram 200. Particularly, a transfer block 210 models the effect of the magneto-resistive asymmetry phenomenon on the reading signal Vin (in the following, indicated with the term "distorted signal"). For this purpose, it is indicated with Vid an ideal reading signal that the reading head would provide without taking into account the effects generated by the magneto-resistive asymmetry phenomenon. According to such model, the distorted signal Vin is equal to:

$$V_{in} = V_{id} + \alpha V_{id}^2 \tag{1}$$

wherein $\alpha$, the distortion coefficient, indicates the percentage of second order distortion introduced in the ideal signal Vid. The value of the distortion coefficient $\alpha$ depends on the type of read head that is used. Such distortion coefficient $\alpha$ is non-dimensional, can take both positive and negative values, and its absolute value is normally at most 0.2.

It can be noted, by observing equation (1), that the distorted signal Vin has a second harmonic component, because the second member of equation (1) has a term that includes the square of the ideal reading signal Vid.

For the purpose of eliminating as much as possible the contribution of the quadratic component of the distorted signal Vin, and thus obtaining back a signal that is similar to the ideal reading signal Vid, a corrector circuit is cascade connected with the output of the read head. A circuit of such a type is also referred to as Magneto-Resistive Asymmetry linearizer (MRA). Said corrector circuit is shown in FIG. 2 as a further transfer block 220. More particularly, to the transfer block 220 is input the distorted voltage signal Vin, and the block 220 outputs a corrected voltage signal Vout, according to the following equation:

$$V_{out} = V_{in} + \beta V_{in}^2 \tag{2}$$

where $\beta$ (non-dimensional) is called a correction coefficient. Expressing the corrected voltage signal Vout as a function of the ideal reading voltage signal Vid:

$$V_{out} = V_{id} + \alpha V_{id}^2 + \beta (V_{id} + \alpha V_{id}^2)^2 \tag{3}$$

$$V_{out} = V_{id} + (\alpha + \beta) V_{id}^2 + 2\alpha \beta_{id}^3 + \alpha^2 \beta V_{id}^4 \tag{4}$$

it is possible to establish the value of the correction coefficient $\beta$ needed for removing the second harmonic of the corrected voltage signal Vout. By observing equation (4), for each value of the distortion coefficient $\alpha$ there exists one and only one value of the correction coefficients $\beta$ that allows completely cancelling the presence of the second harmonic from the corrected voltage signal Vout. Indeed, by choosing a correction coefficient $\beta$ having the same absolute value of the distortion coefficient $\alpha$, but having the opposite sign, the term $(\alpha+\beta)(Vid)^2$, responsible of the second harmonic generation, is reduced to zero. By observing again equation (4) it can be noted that with the addition of the transfer block 220, additional components of third and fourth harmonics, represented by the terms $2\alpha\beta(Vid)^3$ and $2\alpha\beta(Vid)^4$, respectively, are generated. However, the effect of these components of third and fourth harmonics is negligible with respect to that of the fundamental harmonic component, i.e., with respect to Vid, since the absolute value of the coefficient $\alpha$ is less than 0.2 and the absolute value of the coefficients $\beta$ has been set equal to that of $\alpha$. It is noted that even if it were not possible to make a corrector circuit characterized by a correction coefficient $\beta$ adapted to completely remove the second harmonic from the corrected voltage signal, i.e., with $\beta=-\alpha$, such second harmonic may be reduced in a satisfactory way for all the values of $\beta$ close to $-\alpha$.

For implementing equation (2), in such a way to eliminate the quadratic component of the distorted signal Vin (or at least for reducing it as much as possible) for whichever value of the distortion coefficient $\alpha$ that is allowable, the corrector circuit is capable of allowing the programming of the corrector coefficient $\beta$ both for positive and negative values.

Figure 3:
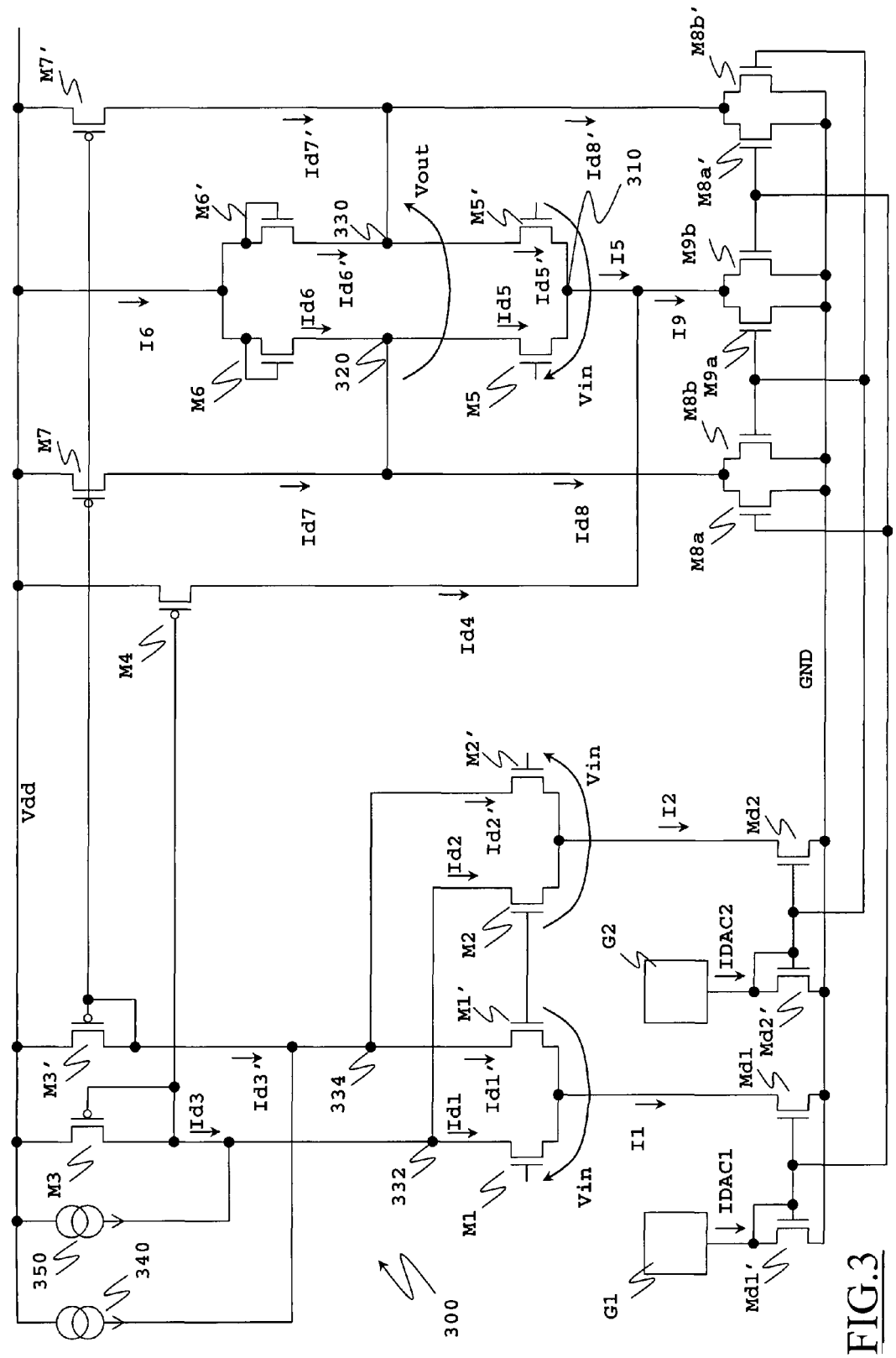
FIG. 3 illustrates a schematic arrangement of the corrector circuit according to an embodiment of the present invention.

Making now reference to FIG. 3, the structure of the corrector circuit (indicated with 300) is illustrated according to an embodiment of the present invention. The corrector circuit 300 is composed by a plurality of transistors M1-M7, M1'-M7', M8a, M8b, M8a', M8b', M9a, M9b, Md1, Md2, connected as shown in FIG. 3.

Particularly, the corrector circuit 300 includes a transconductance-on-transconductance amplifier 310. More in detail, an input transconductance circuit formed by the differential pair of NMOS transistors M5, M5' converts the distorted (voltage) signal Vin into a current; such current is provided to an output transresistance circuit formed by the pair of NMOS transistors M6, M6', which converts it into the corrected (voltage) signal Vout.

For this purpose, the transistor M5 has the source terminal connected to the source terminal of the transistor M5' (circuit node 310), and the drain terminal connected to the source terminal of the transistor M6 (circuit node 320), while the transistor M5' has the drain terminal connected to the source terminal of the transistor M6' (circuit node 330). The distorted signal Vin is applied between the gate terminal of the transistor M5 (positive input terminal) and the gate terminal of the transistor M5' (negative input terminal). The two transistors M6 and M6' are connected in a diode-configuration (with the gate terminal connected to the drain terminal). Moreover, the drain terminals of the transistors M6 and M6' are connected together to a terminal that provides a supply voltage Vdd. The signal Vout is provided between the drain terminal of the transistor M5' (positive output terminal) and the drain terminal of the transistor M5 (negative output terminal).

The amplifier 310 is biased by means of a current I5, provided to the circuit node 310. Such biasing current I5 is equal to a constant current I9, provided by the sum of the currents generated by the current mirror formed by the NMOS transistors Md1', M9b and by the current mirror formed by the NMOS transistors Md2', M9a, from which a variable component Id4 depending on the distorted signal Vin is subtracted, as it will be explained in detail in the following of the present description.

For this purpose, the transistor M9b has the drain terminal connected to the circuit node 310, the source terminal connected to a terminal providing a reference (ground) voltage GND, and the gate terminal connected to the gate terminal of the transistor Md1'. The transistor Md1' has the source terminal connected to the ground terminal, and the drain terminal that is connected to the gate terminal. Moreover, the transistor Md1' receives at its drain terminal a current IDAC1 having a programmable value, provided by a programmable current generator G1.

In a similar way, the transistor M9a has the drain terminal connected to the circuit node 310, the source terminal connected to the ground terminal, and the gate terminal connected to the gate terminal of the transistor Md2'. The transistor Md2' has the source terminal connected to the ground terminal, and the drain terminal that is connected to the gate terminal. Moreover, the transistor Md2' receives at its drain terminal a current IDAC2 having a programmable value, provided by a further programmable current generator G2.

As it will be explained in detail in the following of the present description, the programmability of the correction coefficient β is obtained by means of two further transconductance circuits, formed by the differential pair of NOS transistors M1, M1', and by the differential pair of NOS transistors M2, M2'.

Particularly, the transistor M1 has the source terminal connected to the source terminal of the transistor M1', and the drain terminal connected to the drain terminal of the transistor M2 (circuit node 332). The transistor M1' has the drain terminal connected to the drain terminal of the transistor M2' (circuit node 334). The transistors M2 and M2' have the source terminals connected to each other. The distorted signal Vin is applied between the gate terminal of the transistor M1 (positive input terminal of the pair M1, M1'), and the gate terminal of the transistor M2 (negative input terminal of the pair M2, M2).

The differential pair M1, M1' is biased by means of a current I1 provided by the programmable generator G1 through the current mirror formed by the NMOS transistors Md1', Md1. In particular, the source terminals of the transistors M1 and M1' are connected to the drain terminal of the transistor Md1. The transistor Md1 has the source terminal connected to the ground terminal, and the gate terminal connected to the gate terminal of the transistor Md1'.

In a similar way, the differential pair M2, M2' is biased by means of a current I2 provided by the programmable generator G2 through the current mirror formed by the NMOS transistors Md2', Md2. Particularly, the source terminals of the transistors M2', M2 are connected to the drain terminal of the transistor Md2. The transistor Md2 has the source terminal connected to the ground terminal, and the gate terminal connected to the gate terminal of the transistor Md2'.

The load of the two transconductance circuits described above is formed by the two PMOS transistors M3 and M3', connected in a diode-configuration. More in particular, the transistor M3 has the drain terminal connected to the drain terminal of the transistor M1, the gate terminal connected to the drain terminal, and the source terminal connected to the supply terminal. In the same way, the transistor M3' has the drain terminal connected to the drain terminal of the transistor M1', the gate terminal connected to the drain terminal, and the source terminal connected to the supply terminal.

Through the transistor M3 flows a current Id3, which is mirrored by means of a further PMOS transistor M4, that generates a corresponding current Id4. The transistor M4 has the source terminal connected to the supply terminal, the gate terminal connected to the gate terminal of the transistor M3, and the drain terminal connected to the source terminals of the transistors M5 and M5' (circuit node 210).

The transistor M3' is crossed by a current Id3', which is mirrored by means of two further PMOS transistors M7, M7' that generate the currents Id7 and Id7', respectively. Particularly, the transistor M7 has the source terminal connected to the supply terminal, the gate terminal connected to the gate terminal of the transistor M3, and the drain terminal connected to the node 320. The transistor M7' has the source terminal connected to the supply terminal, the gate terminal connected to the gate terminal of the transistor M3', and the drain terminal connected to the node 330.

The circuit node 320 is further connected to the drain terminals of the NMOS transistors M8a and M8b that form with the transistors Md1' and Md2', respectively, two further current mirrors. The transistor M8a has the source terminal connected to the ground terminal, and the gate terminal connected to the gate terminal of the transistor Md1'. The transistor M8b has the source terminal connected to the ground terminal, and the gate terminal connected to the gate terminal of the transistor Md2'.

The circuit node 330 is further connected to the drain terminals of the NMOS transistors M8a' and M8b', that form with the transistors Md1' and Md2', respectively, two further current mirrors. The transistor M8a' has the source terminal connected to the ground terminal, and the gate terminal connected to the gate terminal of the transistor Md1'. The transistor M8b' has the source terminal connected to the ground terminal, and the gate terminal connected to the gate terminal of the transistor Md2'.

Finally, the corrector circuit 300 includes two direct current generators 340, 350. The current generator 340 is connected between the supply terminal and the node 334; the current generator 350 is connected between the supply terminal and the node 332.

In the following of the present description, in order to describe the electric behavior of the MOS transistors included in the corrector circuit 300, descriptive models will be used, that make use of first order ideal equations. As a consequence, the equation that describes the current flowing trough a generic transistor in the saturation mode is expressed in the following way:

$$I = K(V_{GS} - V_T)^2, \quad (5)$$

$$K = \frac{1}{2}\mu C_{OX}\left(\frac{W}{L}\right) \quad (6)$$

where μ is the mobility of the charge carriers, $C_{OX}$ is the capacity per unity of area of the oxide positioned under the gate terminal, W and L are the width and the length, respectively, of the transistor channel, $V_T$ is the threshold voltage, and $V_{GS}$ is the voltage between the gate terminal and the source terminal. Particularly, in correspondence of the references of the currents I and the coefficients K of each transistor mentioned in the present description, for the sake of clarity, it will be added a number indicative of the transistor to which they belong.

By observing the amplifier circuit, and by defining with Id5, Id5', Id6, Id6' the currents that flow through the transistors M5, M5', M6, M6', respectively, it can be easily understood that the correct signal Vout depends on the distorted signal Vin according to the following equation:

$$V_{out} = \frac{gm5}{gm6}V_{in}, \quad (7)$$

where $$gm_5 = 2(\sqrt{K_5 I_{d5}}) \quad (8)$$

represents the transconductance of the pair of transistors M5, M5', while $$gm_6 = 2(\sqrt{K_6 I_{d6}}) \quad (9)$$

represents the transconductance of the pair of transistors M6, M6'.

As a consequence, for the purpose of reaching the desired result, equation (7) respects the equation (2) as well, that is, the corrector circuit 300 is such that the ratio between the two transconductances gm5/gm6 will be proportional to (1+βVin), with the correction coefficient β programmable both for positive and negative values. For this purpose, the biasing current I5 of the transistors M5 and M5', sum of the currents Id5 and Id5', is equal to the constant current I9 minus the variable current Id4.

The variable current Id4 depends in turn on the currents Id3 and Id3', which flow through the transistors M3, M3', respectively. By considering the Kirchhoff's equations of the nodes 332 and 334, it is possible to calculate the currents Id3 and Id3':

$$I_{d3} = I_{d1} + I_{d2} - k(I_1 + I_2) \quad (10)$$

$$I'_{d3} = I'_{d1} + I'_{d2} - k(I_1 + I_2), \quad (11)$$

where Id1, Id1', Id2, Id2' are the currents of the transistors M1, M1', M2, M2', respectively, and k(I1+I2) is the (constant) value of the current generated by the generators 340, 350 (k is a proportionality constant). The function of the generators 340, 350 is to reduce the current that is mirrored by the transistors M3 and M3'; in particular, a component of the current depending on the biasing currents I1 and I2 is reduced. Such reduction is advantageous if the non ideal voltage/current characteristic being typical of the current mirrors is taken into account.

The differential pair of transistors M1, M1' is biased by the current I1, equal to the sum of the currents Id1 and Id1', while the differential pair of transistors M2, M2' is biased by the current I2, equal to the sum of the currents Id2 and Id2'. By defining with gm1 the transconductance of the differential pair of transistors M1, M1', and by defining with gm2 the transconductance of the differential pair of transistors M2, M2', equations (10) and (11) become the following:

$$I_{d3} = \frac{I_1 + I_2}{2} - k(I_1 + I_2) + (gm_1 - gm_2)\frac{V_{in}}{2} \quad (12)$$

$$I'_{d3} = \frac{I_1 + I_2}{2} - k(I_1 + I_2) - (gm_1 - gm_2)\frac{V_{in}}{2}. \quad (13)$$

It has to be noted that both the current Id3 and the current Id3' include a fixed component which depends on the biasing currents I1, I2, and a component which depends on the distorted signal Vin.

As already mentioned in the foregoing, the transistors M3 and M4 are connected in such a way to form a current mirror. As a consequence, the relation between the currents Id3 and Id4 depends on the aspect ratios (W/L) of the two transistors:

$$I_{d4} = \frac{K_4}{K_3}I_{d3} = \frac{K_4}{K_3}\left(\frac{I_1 + I_2}{2} - k(I_1 + I_2) - (gm_1 - gm_2)\frac{V_{in}}{2}\right). \quad (14)$$

In the same way, also the transistors M3' and M7 are connected in such a way to form a further current mirror. As a consequence, the current that flows through the transistor M7, denoted with Id7, will be equal to:

$$I_{d7} = \frac{K_7}{K_3}I'_{d3} = \frac{K_7}{K_3}\left(\frac{I_1 + I_2}{2} - k(I_1 + I_2) - (gm_1 - gm_2)\frac{V_{in}}{2}\right). \quad (15)$$

As previously mentioned, the biasing current I5 of the transistors M5 and M5' will result equal to:

$$I_5 = I_9 - I_{d4}. \quad (16)$$

As a consequence, by using the equation (14) it is obtained that:

$$I_5 = \left(I_9 - \frac{K_4}{K_3}\left(\frac{I_1 + I_2}{2} - k(I_1 + I_2)\right)\right) - \frac{K_4}{K_3}(gm_1 - gm_2)\frac{V_{in}}{2}, \quad (17)$$

that is, the biasing current I5 includes a component that depends on the distorted signal Vin.

The current mirror formed by the transistors M7, M8a, M8b and the current mirror formed by the transistors M7', M8a', M8b' have the purpose of influencing the current that flows through the pair of transistors M6, M6', thereby removing the component that depends on the distorted signal Vin. In this way, the transistors M6, M6' are biased by means of a current having a constant common-mode value, which is independent of Vin.

The common-mode current of the pair M6, M6', indicated with I6, equals:

$$I_6 = I_{d6} + I'_{d6} = I_{d8} + I_{d8}' + I_5 - I_{d7} - I'_{d7}, \quad (18)$$

being Id7, Id7' the currents generated by the transistors M7 and M7', respectively, and Id8, Id8' the currents drained by the transistors M8a, M8b, M8a', M8b', respectively.

The transistors M1, M2, M7, M7', M8a, M8a', M8b, M8b', M9a, M9b are dimensioned in such a way to satisfy the following conditions:

—Kd1=Kd2=K2, i.e., the transistors M1, M2 are dimensioned in such a way to have the same aspect ratio;

—K8a=K8b=K8a'=K8b'=K8, i.e., the transistors M8a, M8b, M8a' and M8b' are dimensioned in such a way to have the same aspect ratio; and K9a=K9b=K9, i.e., the transistors M9a and M9b are dimensioned in such a way to have the same aspect ratio.

As a consequence, the currents Id8, Id8' may be expressed as a function of the biasing currents I1, I2, in this way:

$$I_{d8} = I'_{d8} = \frac{K_8}{K_d}(I_1 + I_2). \tag{19}$$

By using the equations (15), (17) and (19), equation (18), which expresses the common-mode current of the pair M6, M6', becomes:

$$I_6 = 2\frac{K_8}{K_d}(I_1 + I_2) + I_9 - \tag{20}$$
$$\frac{K_4}{K_3}\left(\frac{I_1 + I_2}{2} - k(I_1 + I_2)\right) - \frac{K_4}{K_3}(gm_1 - gm_2)\frac{V_{in}}{2} +$$
$$-2\frac{K_7}{K_3}\left(\frac{I_1 + I_2}{2} - k(I_1 + I_2) - (gm_1 - gm_2)\frac{V_{in}}{2}\right).$$

By setting $$\frac{K_4}{K_3} = 2\frac{K_7}{K_3}, \tag{21}$$

that is, by making the transistor M7 with an aspect ratio that is twice that of the transistor M4, the terms of the equation (20) including the distorted signal Vin disappear. In this way, the current I6 is independent of the distorted signal Vin.

By further setting that:

$$\frac{K_7}{K_3} = 2\frac{K_8}{K_d}, \tag{22}$$

the current Id8 equals the current Id7 when the distorted signal Vin is absent (Vin=0).

By taking into account the equations (21) and (22), equation (20) may be simplified;

$$I_6 = I_9 - \frac{K_4}{K_3}\left(\frac{I_1 + I_2}{2} - k(I_1 + I_2)\right). \tag{23}$$

By observing the previous equation, it can be noted that the current I6 is independent of the distorted signal Vin.

By substituting the equations (8), (9), (17) and (23) into equation (7), it is possible to obtain the relation between the distorted signal Vin and the corrected signal Vout in different terms:

$$V_{out} = \sqrt{\frac{K_5}{K_6}} \sqrt{1 - \frac{\frac{K_4}{2K_3}(gm_1 - gm_2)V_{in}}{I_9 - \frac{K_4}{K_3}\left(\frac{I_1 + I_2}{2} - k(I_1 + I_2)\right)}} V_{in}. \tag{24}$$

Making the hypothesis that:

$$\left|\frac{\frac{K_4}{2K_3}(gm_1 - gm_2)V_{in}}{I_9 - \frac{K_4}{K_3}\left(\frac{I_1 + I_2}{2} - k(I_1 + I_2)\right)}\right| V_{in} \ll 1, \tag{25}$$

it is possible to approximate the equation (24) in the following way:

$$V_{out} \cong \sqrt{\frac{K_5}{K_6}}\left(1 - \frac{\frac{K_4}{2K_3}(gm_1 - gm_2)V_{in}}{I_9 - \frac{K_4}{K_3}\left(\frac{I_1 + I_2}{2} - k(I_1 + I_2)\right)}\right) V_{in}. \tag{26}$$

By observing equation (26), it is possible to note that the relationship relating thereto corresponds to the desired relationship expressed by the equation (2), if:

$$\beta = \left(\frac{\frac{K_4}{2K_3}(gm_1 - gm_2)}{I_9 - \frac{K_4}{K_3}\left(\frac{I_1 + I_2}{2} - k(I_1 + I_2)\right)}\right). \tag{26}$$

is considered the correction coefficient β.

The programmability of said correction coefficient is due to the programmability of the transconductances gm1, gm2 of the transistors M1, M1' and M2, M2'. Indeed, the values of such transconductances are a function of the respective biasing currents I1, I2, in turn depending on the currents IDAC1 and IDAC2. As already cited in the foregoing, it is possible to program the values of the currents IDAC1 and IDAC2, thus setting the value of the transconductances gm1 and gm2. By varying the values of the currents IDAC1 and IDAC2 in such a way to respect the condition that the sum of the currents I1+I2 is keep constant, it is possible to vary the value of the correction coefficient β, both for positive values (when gm1 is higher than gm2) and for negative values (when gm1 is lower than gm2).

Naturally, in order to satisfy local and specific requirements, a person skilled in the art may apply to the solution described above many modifications and alterations. Particularly, although one or more embodiments of the present invention have been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations can be applied if the mass storage system has a different structure, or if it includes equivalent elements.

Regarding the structure of the corrector circuit, it is not excluded the use of current mirrors of different topologies, or of loads different from the pair of diode-connected transistors. In any case, the corrector circuit may be made with other components (for example, bipolar transistors).

The implementation of the transconductance circuit with the corresponding load in a non-differential form is also contemplated.

Nothing prevents the direct generation of the biasing current (with a single component).

Similar considerations apply if the two components of the biasing current are obtained in a different way.

It is also contemplated the possibility of generating the programmable currents in a different way, for example, by using programmable current generators of the analog type.

In this case as well, it is contemplated the implementation of the corresponding transconductance circuits in a non-differential form.

Moreover, the two current generators may be also omitted, thus accepting a consequent degradation regarding the current mirror performances.

In any case, the linearization current may be obtained in another way (for example, without dedicated generators).

It is contemplated a different way for generating the fixed component of the biasing current (for example, by means of a further generator).

Furthermore, it is not excluded an implementation in which the variable component of the biasing current of the load is omitted (even if far less advantageous).

It has to be underlined that, even if in said document reference has been made to second harmonic distortions introduced by the magneto-resistive effect, an embodiment of the corrector circuit may be used for correcting second harmonic distortions provoked by other effects, for example, in a reading signal generated by an optical read head used in an optical mass-storage system.

A disk-drive having a controller that includes the corrector circuit of FIG. 3 may be included in a larger system such as a computer system.

What is claimed is:

1. An integrated circuit, comprising:
    an input node operable to receive an input signal representing data and having a first distortion component;
    an output node;
    a first stage coupled to the input and output nodes and operable to receive a correcting signal, and
        generate on the output node from the input signal and correcting signal, an output signal including a second distortion component having a magnitude that is smaller than a magnitude of the first distortion component;
    a second stage coupled to the input node and to the first stage and operable to generate the correcting signal from the input signal.

2. A system, comprising:
    a medium for storing data;
    a read head in communication with the medium and operable to generate a read signal representing the data and having a first distortion component; and
    an integrated circuit, comprising:
        an input node coupled to the read head and operable to receive the read signal,
        an output node,
        a first stage coupled to the input and output nodes and operable to receive a correcting signal, and
            generate on the output node from the read signal and correcting signal, an output signal including a second distortion component having a magnitude that is smaller than a magnitude of the first distortion component,
        a second stage coupled to the input node and to the first stage and operable to generate the correcting signal from the read signal.

3. The system of claim 2 wherein:
    the storage medium comprises a magnetic disk; and
    the read head comprises a magneto-resistive read head.

4. A system, comprising:
    a controller; and
    an integrated circuit coupled to the controller and comprising
        an input node operable to receive an input signal representing data and having a first distortion component,
        an output node,
        a first stage coupled to the input and output nodes and operable to receive a correcting signal, and
            generate on the output node from the input signal and correcting signal, an output signal including a second distortion component having a magnitude that is smaller than a magnitude of the first distortion component;
        a second stage coupled to the input node and to the first stage and operable to generate the correcting signal from the input signal.

5. A method, comprising:
    receiving an input signal having a first level of distortion;
    generating a first correcting signal from the input signal; and
    generating from the input signal and correcting signal, an output signal having a second level of distortion that is lower than the first level.

6. The method of claim 5 wherein receiving the input signal comprises receiving the input signal from a magneto-resistive read head.

7. The method of claim 5 wherein generating the correcting signal comprises:
    respectively biasing with a first and a second substantially constant current a first and a second amplifier that share a common input node and a common output node;
    amplifying the input signal with each of the two amplifiers to generate the correcting signal on the common output node.

8. The method of claim 5 wherein generating the correcting signal comprises:
    respectively biasing with a first and a second substantially constant current a first and a second differential amplifier that share a pair of common input nodes and a pair of common output nodes;
    amplifying the input signal with each of the two amplifiers to generate the correcting signal on one of the common output nodes.

9. The method of claim 5 wherein generating the output signal comprises:
    generating a bias current from the correcting signal and from a substantially constant reference current;
    conducting the bias current with an amplifier;
    amplifying the input signal with the amplifier; and
    generating the output signal from the amplified input signal.

10. A method, comprising:
    receiving an input signal having a first level of distortion;
    generating a first correcting signal from the input signal;
    generating a second correcting signal from the input signal; and
    generating from the input and correcting signals an output signal having a second level of distortion that is lower than the first level;
    wherein generating the output signal comprises
    generating a first bias current from the first correcting signal and a substantially constant reference current,
    conducting the first bias current with an amplifier, conducting a second bias current through a load that is coupled to the amplifier at an output node, coupling the second correcting signal to the output node to maintain the second bias current at a substantially constant level, amplifying the input signal with the amplifier, and generating the output signal on the output node.

11. A method, comprising:

receiving an input signal having a first level of distortion;

generating a first correcting signal from the input signal;

generating a second correcting signal from the input signal; and generating from the input and correcting signals an output signal having a second level of distortion that is lower than the first level;

wherein generating the output signal comprises generating a first bias current from the first correcting signal and a substantially constant reference current, conducting the first bias current with a differential amplifier, conducting a second bias current through a differential load that is coupled to the amplifier at two output nodes, coupling the second correcting signal to each of the output nodes to maintain the second bias current at a substantially constant level, amplifying the input signal with the amplifier, and generating the output signal across the output nodes.

* * * * *

UNITED STATES PATENT AND TRADEMARK OFFICE
CERTIFICATE OF CORRECTION

| | | |
|---|---|---|
| PATENT NO. | : 7,986,479 B2 | Page 1 of 1 |
| APPLICATION NO. | : 11/711477 | |
| DATED | : July 26, 2011 | |
| INVENTOR(S) | : Giacomino Bollati et al. | |

It is certified that error appears in the above-identified patent and that said Letters Patent is hereby corrected as shown below:

Column 4, Line 16, Equation 4 of the patent, please change "$2\alpha\beta_{id}^3$" to --$2\alpha\beta V_{id}^3$--

Column 5, Lines 42-43 of the patent, please change the text "NOS" to --MOS--

Signed and Sealed this

Thirteenth Day of November, 2012

David J. Kappos
*Director of the United States Patent and Trademark Office*